United States Patent [19]

Kim et al.

[11] Patent Number: 5,142,541
[45] Date of Patent: Aug. 25, 1992

[54] ERROR-BIT GENERATING CIRCUIT FOR USE IN A NON-VOLATILE SEMICONDUCTOR MEMORY DEVICE

[75] Inventors: Jin-Ki Kim, Daegu; Hyung-Kyu Yim, Seoul, both of Rep. of Korea

[73] Assignee: Samsung Electronics Co., Ltd., Suwon, Rep. of Korea

[21] Appl. No.: 292,104

[22] Filed: Dec. 30, 1988

[30] Foreign Application Priority Data

Dec. 15, 1988 [KR] Rep. of Korea ............... 1988-16715

[51] Int. Cl.⁵ .......................................... H03M 13/00
[52] U.S. Cl. ................................... 371/40.2; 371/51.1
[58] Field of Search ............... 371/3, 40.2, 37.7, 51.1, 371/13, 21.3, 21.2, 40.1

[56] References Cited

U.S. PATENT DOCUMENTS

| | | | |
|---|---|---|---|
| 3,568,153 | 3/1971 | Kurtz et al. | 371/40.2 |
| 3,868,632 | 2/1975 | Hong et al. | 371/37.7 |
| 4,112,502 | 9/1978 | Scheuneman | 371/13 |
| 4,561,095 | 12/1985 | Khan | 371/40.1 |
| 4,604,749 | 8/1986 | Shinoda et al. | 371/13 |
| 4,672,614 | 6/1987 | Yoshida | 371/40.2 |
| 4,780,875 | 10/1988 | Sakai | 371/40.2 |
| 4,821,240 | 4/1989 | Nakamura et al. | 371/13 |
| 4,878,220 | 10/1989 | Hashimoto | 371/3 |

*Primary Examiner*—Jerry Smith
*Assistant Examiner*—Phung Chung
*Attorney, Agent, or Firm*—Robert E. Bushnell

[57] ABSTRACT

An error-bit generating circuit for use in a nonvolatile semiconductor memory device, particularly in an EEPROM. The circuit is capable of easily checking the deterioration of operational performance in an error checking correction device thereof, by intentionally writing bit-error data into a memory cell thereof. The error-bit generating circuit includes a parity generator for generating specified bits of parity data according to input data received from an input buffer, means for writing into a memory cell array the input data and parity data, means for, after reading out the input data and parity data from the memory cell array, correcting an error-bit among the input data and then providing the corrected data, and an error-bit generator coupled between the input buffer and the memory cell array, for generating an error-bit signal onto a selected bit of the input data in response to a control signal and an address signal.

17 Claims, 2 Drawing Sheets

ERROR-BIT GENERATING CIRCUIT FOR USE IN A NON-VOLATILE SEMICONDUCTOR MEMORY DEVICE

BACKGROUND OF THE INVENTION

The present invention relates to a nonvolatile semiconductor memory device having therein an error checking and correction (hereinafter referred to as ECC), and more particularly to an error-bit generating circuit for use in the nonvolatile semiconductor memory device.

A nonvolatile semiconductor memory device currently in wide use, has been an electrically erasable programmable read only memory (EEPROM) device of floating gate tunnel oxide (FLOTOX) type. There has also been used an EEPROM device capable of performing a data read-out operation on a single byte. However, due to the possible generation of an error bit in such a data read-out operation, there may occur a decrease in the reliability and yield of the EEPROM. Most of the error-bit generation is caused by a data retention defect due to a defect in the tunnel oxide. As the integration of circuitries in the EEPROM is made of larger scale, a probability of error-bit generation in a single byte becomes higher.

In order to overcome a problem described above, an error correction circuit (i.e., and "ECC") is included in the EEPROM device recently used, thereby achieving the improvement in its reliability and yield. The modified EEPROM having the built-in ECC circuit is disclosed, for example, in Digest of Technical Papers, pages 83 and 84, August 1988, SYMPOSIUM ON VLSI CIRCUITS. When a bit failure occurs during the use of the device, the user generally makes a correction by using the ECC operational. However, such an ECC operation can lead to a drop in the operation performance of the EEPROM, according to a data access time, current consumption, etc. Therefore, a manufacturer needs to measure, by a chip test, the data access time or the current consumption caused by using the ECC device according to the bit error, upon completion of manufacture of the EEPROM device. To easily achieve such measurement, there is required a device that is capable of generating an error bit in a desired bit position. However, in a known EEPROM device having therein a built-in ECC circuit, it is very difficult to completely measure the effect of ECC operation in the EEPROM, because of having no error-bit generating circuit therein.

SUMMARY OF THE INVENTION

An object of the present invention is, to provide an error-bit generating circuit for use in the EEPROM, being capable of easily checking the deterioration of operational performance in an ECC device, by intentionally writing bit-error data into a memory cell thereof.

According to the present invention, an error-bit generating circuit is provided for a nonvolatile semiconductor memory device, including a parity generator for generating specified bits of parity data according to input data received from an input buffer, means for writing into a memory cell array the input data and parity data, means for, after reading out said input data and parity data from the memory cell array, correcting an error-bit among the input data and then providing the corrected data, and an error-bit generating stage coupled between the input buffer and memory cell array, for generating an error-bit signal onto a selected bit of the input data in response to a control signal and an address signal.

DETAILED DESCRIPTION OF THE INVENTION

Hereinafter, the invention will be described in detail with reference to the accompanying drawings, by way of example.

Figure 1:
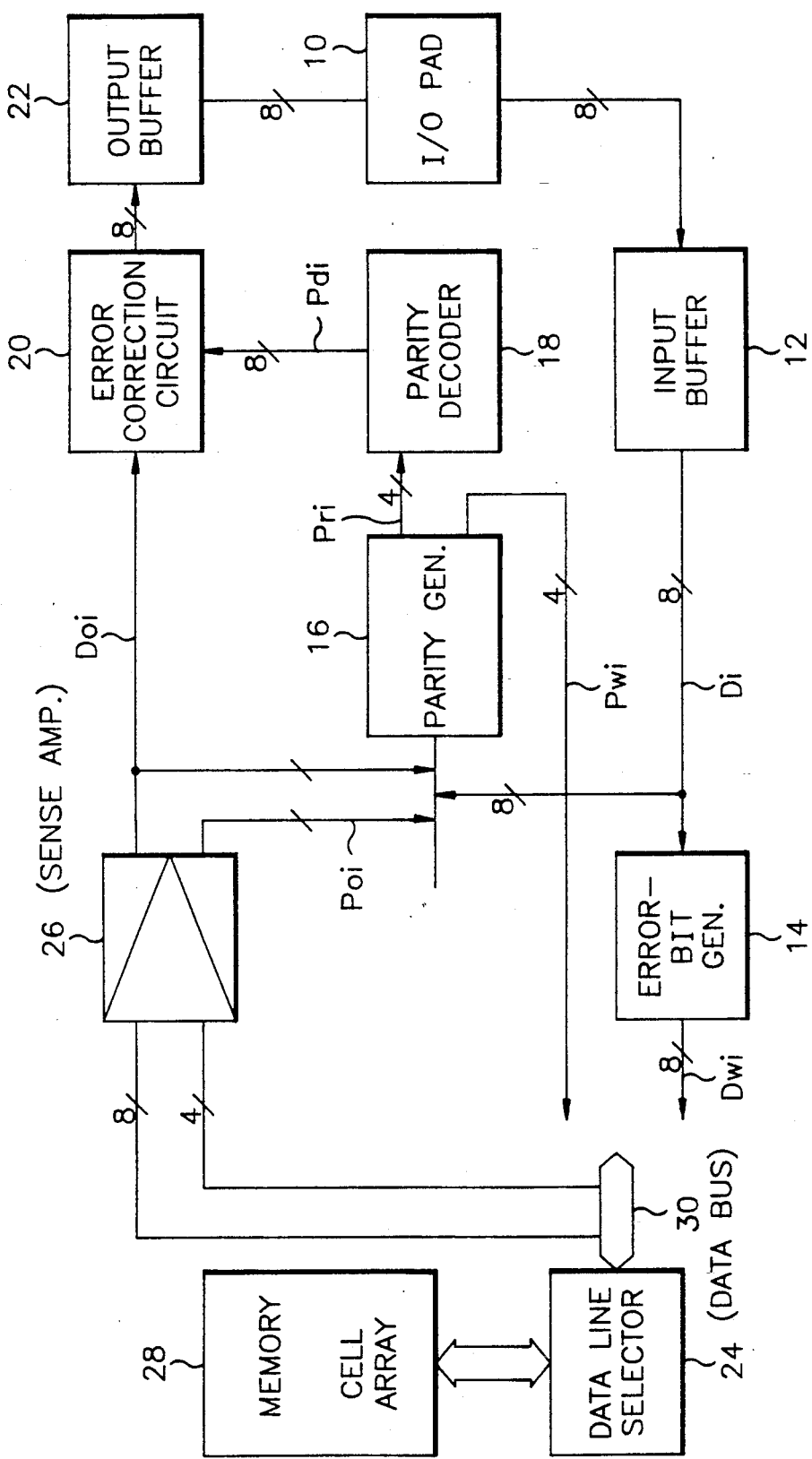
FIG. 1 is a block diagram showing a nonvolatile semiconductor memory device including therein an error-bit generating circuit according to a preferred embodiment of the present invention.

FIG. 1 is a block diagram of an embodiment showing an EEPROM device of the present invention, in which an error-bit generating circuit is provided. The circuit of FIG. 1 is constituted by memory cell array 28, data line selector 24, sense amplifier 26, error correction circuit 20, parity generator 16, parity decoder 18, error-bit generating circuit 14, output buffer 22, input buffer 12, and input/output (I/O) pad 10. The parity generator 16, parity decoder 18, and error correction circuit 20 construct a conventional ECC circuit. To input pins of the input/output pad 10 the input buffer 12 is connected for converting a data level of one byte (8-bits) data received from the input/output pad to the other data level suitable for the internal circuit. The input data Di is supplied through data lines to the parity generator 16 and the error-bit generating circuit 14, respectively. Upon receipt of the input data Di from the input buffer 12, the parity generator 16 produces an output signal, i.e., 4-bit parity data Pwi at an output terminal. The output signal is made by using a known Modified Hamming Code method in which the input data Di from the buffer 12 is changed into the 4-bit parity data, and another output signal Pri is provided to the parity decoder 18 which is connected to an output of the generator 16. At the same time, after receiving an input data Di from an input buffer 12, an error-bit generating circuit 14 produces a 1-bit error signal in any one designated bit of the 8-bit input data Di, in response to an address signal designating an error-bit position according to the present invention. An output signal Dwi of the error-bit generator 14, having one-bit error signal, is supplied to a data base bus line 30, and the 4-bit parity data Pwi from the parity generator 16 is also provided to the data bus line 30. Both of the output signal Dwi and the parity data Pwi are also supplied through a data bus line 30 to a data line selector 24. Both of the data (totally 12 bits) are written through the data line selector 24 into a 12-bit memory cell in the memory cell array 28, being selected by a row decoder and a column decoder (not shown).

Now, a description is given of a read-out operation of data stored in the memory cell array 28. The 12-bit data stored in a memory cell designated by the row and column decoder, including 8-bit write-in data and 4-bit parity data thereof, is read out by a data read-out instruction, and then supplied, through the data line selector 24 and the data bus line 30, to an input of the sense amplifier 24. The data line selector 24 is provided for selecting the 12-bit write-in or read-out data to or from bit lines in the memory cell array 28. The sense amplifier 26 that senses and amplifies the read-out data from the memory cell array 28 provides its output signal including the 8-bit read-out data Doi and the 4-bit parity data Poi, to the parity generator 16. Simultaneously, to the error correction circuit 20, the 8-bit read-out data Doi is also provided. From the output signals of the sense amplifier 26, the parity generator 16 produces 4-bit parity data Pri to the parity decoder 18, wherein the parity data Pri is generated from both the 8-bit read-out data Doi and the 4-bit parity data Poi, through the parity generator. The parity decoder 18 produces data Pdi for designating a position of the 1-bit error made in the 8-bit read-out data Doi, by the inputting of the 4-bit parity data Pri.

The error correction circuit 20, which conventionally has eight exclusive-OR gates, corrects the single error-bit of the 8-bit read-out data Doi, in accordance with the data Pdi for determining the error-bit position delivered from the parity decoder 18, and the corrected output thereof is then supplied, through the output buffer 22, to the output pin of the input/output pad 10. Accordingly, the error correction operation will be checked by using the ECC device after writing, into the memory cell array, a single bit error signal generated from the error-bit generating circuit 14 connected between the input buffer 12 and the data line selector 24, whereby the read-out access time and current consumption in the ECC device can be relatively completely measured.

Figure 2:
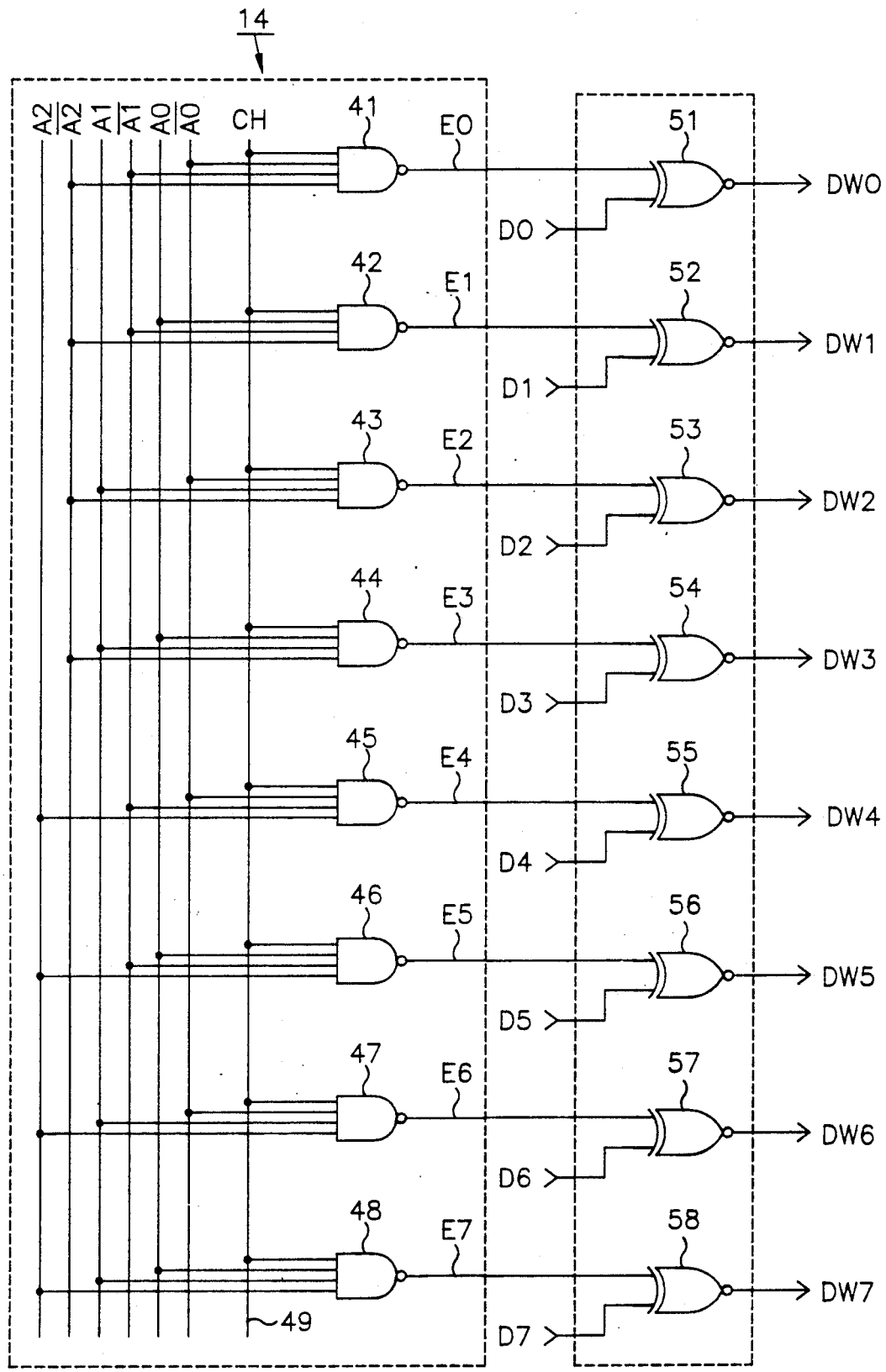
FIG. 2 is a circuit diagram of a preferred embodiment of the error-bit generating circuit.

FIG. 2 shows a preferred embodiment of the error-bit generating circuit according to the present invention. A decoder circuit 40 and an error generation circuit 50 from the error-bit generating circuit 14. The decoder circuit 40 generates logic signals for selecting an error position, and has eight NAND gates 41 to 48, each of the gates having four input terminals. A first input terminal of each NAND gate is connected to a control signal CH, and second, third and fourth input terminals thereof are connected to a combination of address signals A0 to A2 and their inverted address signals $\overline{A0}$ to $\overline{A2}$, as shown in FIG. 2, respectively. The error generation circuit 50 produces error-bit data in response to the logic output of the decoder circuit 40, and uses eight exclusive-NOR gates 51 to 58, with each of the gates having two input terminals. A first input terminal of each exclusive-NOR gate is connected to an output of a respective corresponding NAND gate in the decoder circuit 40, and a second input terminal thereof is connected to each corresponding bit in 8-bit data D0 through D7.

The operation of the circuit 14 shown in FIG. 2 will be explained, hereinafter. The control signal CH controls an output of each of the NAND gates 41 through 48 in the decoder circuit 40, so that it is determined whether the corresponding NAND gate is enabled or disabled. When the control signal CH is in logic HIGH state, all the NAND gates are enabled. When the control signal is in logic LOW state, all the NAND gates are disabled. Therefore, when the NAND gates 41 through 48 are disabled, the outputs of all the corresponding NAND gates are set to a HIGH state, when the NAND gates 41 through 48 are enabled, either one of them is selected in accordance with a logic combination of the address signals A0 to A2 and the inverted address signals A0 to A2, thereby outputting a logic LOW signal. Subsequently, if the logic HIGH output signal from each of all the NAND gates 41 to 48 is input to the first terminal at each of the exclusive-NOR gates 51 to 58, then the exclusive-NOR gates 51 through 58 produce the same output signals as the input data signals D0 to D7. However, when one of any output signals of NAND gates 51 through 58 is set to a HIGH state and the HIGH state signal is input to the corresponding first input terminal of the exclusive-NOR gates 51 through 58, the output of the corresponding exclusive-NOR gate becomes a signal having an inverted logic state from the original input data signal. Therefore, when the decoder circuit 40 is disabled, the error generation circuit 50 produces 8-bit input data D0 to D7 having no error-bit, whereas when the decoder circuit 40 is enabled, the error generation circuit produces 8-bit input data having an error-bit, in which only a single bit designated by the address signal A0–A2 is inverted in its logic state.

As described above, when the error-bit generating circuit according to the present invention is provided in a non-volatile semiconductor memory device having a built-in ECC device, the testing of the correction operation by the ECC device is carried out effectively.

The foregoing description shows only a preferred embodiment of the present invention. Various modifications are apparent to those skilled in the art without departing from the scope of the present invention which is only limited by the appended claims. Therefore, the embodiment shown and described is only illustrative, not restrictive.

What is claimed is:

1. In a non-volatile semiconductor memory device having a parity generator for generating specified bits of parity data according to input data received from an input buffer, means for writing into a memory cell array said input data and said parity data, and means for, after reading out said input data and said parity data from the memory cell array, correcting an error-bit among said input data and then providing the corrected data, further comprising:

error-bit generating means, coupled between said input buffer and the means for writing into said memory cell array, for generating an error-bit as a replacement for a selected bit of the input data in response to a control signal and an address signal.

2. The non-volatile semiconductor memory device of claim 1, wherein said error-bit generating means comprises a plurality of NAND gates equal in number to the number of bits of said input data, for receiving a combination of said control signal and said address signal, and a plurality of EXCLUSIVE-NOR gates each having a first input terminal coupled to corresponding ones of output ports of said NAND gates.

3. The non-volatile semiconductor memory device of claim 2, further comprised of:

means for reading out said input data and parity data from the memory cell array;

said parity generator receiving said input data and said parity data from said reading means for providing, to said error-bit correcting means, parity information based upon said input data and said parity data from said reading means.

4. The non-volatile semiconductor memory device of claim 1, further comprised of:

means for reading out said input data and parity data from the memory cell array;

said parity generator receiving said input data and said parity data from said reading means for providing, to said error-bit correcting means, parity information based upon said input data and said parity data from said reading means.

5. A non-volatile semiconductor memory device, comprising:
   a parity generator for generating specified bits of parity data according to input data received;
   means for writing into a memory cell array said input data and parity data;
   means for, after reading out said input data and said parity data from the memory cell array, correcting an error-bit among the input data and then providing the corrected data; and
   error-bit generating means coupled between an input buffer and the means for writing into a memory cell array, for generating an error-bit signal and for replacing a selected bit of the input data with said error-bit signal in response to a control signal and an address signal.

6. The non-volatile semiconductor memory device of claim 5, wherein said error-bit generating means comprises:
   a plurality of NAND gates equal in number to the number of bits of said input data, for receiving a combination of said control signal and said address signal; and
   a plurality of EXCLUSIVE-NOR gates each having an input terminal coupled to receive output signals from corresponding ones of said NAND gates.

7. The non-volatile semiconductor memory device of claim 6, further comprised of:
   means for reading out said input data and parity data from the memory cell array;
   said parity generator receiving said input data and said parity data from said reading means for providing, to said error-bit correcting means, parity information based upon said input data and said parity data from said reading means.

8. The non-volatile semiconductor memory device of claim 5, further comprised of:
   means for reading out said input data and parity data from the memory cell array;
   said parity generator receiving said input data and said parity data from said reading means for providing, to said error-bit correcting means, parity information based upon said input data and said parity data from said reading means.

9. A non-volatile semiconductor memory device, comprising:
   means for, after reading out input data bits and parity data from a memory cell array, correcting an error-bit among said input data bits and then providing corrected data, and
   error-bit generating means coupled between an input buffer, said input buffer receiving input data for storage into said memory cell array, and the memory cell array, for generating an error-bit signal for replacement of a selected bit of the input data in response to a control signal and an address signal.

10. The non-volatile semiconductor memory device of claim 9, wherein said error-bit generating means comprises a plurality of NAND gates equal in number to the number of bits of said input data, for receiving a combination of said control signal and said address signal.

11. The non-volatile semiconductor memory device of claim 10, wherein said error-bit generating means further comprises a plurality of EXCLUSIVE-NOR gates for receiving input data bits of said input data.

12. The non-volatile semiconductor memory device of claim 11, further comprised of:
   means for reading out said input data bits and parity data from the memory cell array;
   a parity generator for providing said parity data to the memory cell array in dependence upon said input data, for receiving said input data bits and said parity data from said reading means, and for providing, to said error-bit generating means, parity information based upon said input data bits and said parity data read by said reading means from said memory cell array.

13. The non-volatile semiconductor memory device of claim 10, further comprised of:
   means for reading out said input data bits and parity data from the memory cell array;
   a parity generator for providing said parity data to the memory cell array in dependence upon said input data, for receiving said input data bits and said parity data from said reading means, and for providing, to said error-bit generating means, parity information based upon said input data bits and said parity data read by said reading means from said memory cell array.

14. The non-volatile semiconductor memory device of claim 9, further comprised of:
   means for reading out said input data bits and parity data from the memory cell array;
   a parity generator for providing said parity data to the memory cell array in dependence upon said input data, for receiving said input data bits and said parity data from said reading means, and for providing, to said error-bit generating means, parity information based upon said input data bits and said parity data read by said reading means from said memory cell array.

15. A semiconductor memory device, comprising:
   input means for receiving input data;
   parity generator means arranged to receive said input data, for generating bits of parity data according to said input data;
   error-bit generating means, for generating error data by introducing an error-bit for a selected bit of the input data;
   means for writing said error data and said parity data into a memory cell array;
   means for reading said error data and said parity data from the memory cell array;
   said parity generator means providing parity information based upon said error data and said parity data read from the memory cell array; and
   means for providing corrected data by changing said error-bit in said error data read from the memory cell array in response to said parity information.

16. The semiconductor memory device of claim 15, wherein said error-bit generating means comprises:
   a plurality of NAND gates equal in number to the number of bits of said input data, for receiving a combination of a control signal and an address signal; and
   a plurality of Exclusive-NOR gates, with each of said plurality of Exclusive-NOR gates having a first input terminal coupled to corresponding ones of output ports of different ones of said plurality of NAND gates.

17. A process for using a semiconductor memory device, comprising:
   applying input data to the semiconductor memory device;

generating bits of parity data within the semiconductor memory device, according to said input data;

generating error data within said semiconductor memory device by replacing a selected bit of the input data with an error-bit;

writing said error data and said parity data into a memory cell array within the semiconductor memory device;

reading said error data and said parity data from the memory cell array;

generating parity information within the semiconductor memory device in dependence upon said error data and said parity data read from the memory cell array; and providing corrected data by changing said error-bit in said error data read from the memory cell array in response to said parity information.

* * * * *

UNITED STATES PATENT AND TRADEMARK OFFICE
CERTIFICATE OF CORRECTION

PATENT NO. : 5,142,541
DATED : 25 August 1992
INVENTOR(S) : Jin- Ki Kim, et al.

It is certified that error appears in the above-indentified patent and that said Letters Patent is hereby corrected as shown below:

Column 1,

Line 28    Before ""ECC"" change "and" to --an--:

Signed and Sealed this

Eighth Day of October, 1996

Attest:

BRUCE LEHMAN

*Attesting Officer*    *Commissioner of Patents and Trademarks*